United States Patent [19]

Mahler et al.

[11] Patent Number: 4,648,547
[45] Date of Patent: Mar. 10, 1987

[54] METHOD AND APPARATUS FOR ACHIEVING REDUCED COMPONENT FAILURE DURING SOLDERING

[75] Inventors: James A. Mahler, East Windsor Township, Mercer County, N.J.; Gregory C. Munie, Lower Makefield Township, Bucks County, Pa.

[73] Assignee: AT&T Technologies, Inc., Berkeley Heights, N.J.

[21] Appl. No.: 749,045

[22] Filed: Jun. 26, 1985

[51] Int. Cl.[4] .......................................... B23K 31/02
[52] U.S. Cl. .................... 228/180.1; 228/37; 228/42; 228/20
[58] Field of Search ............... 228/180.1, 261, 37, 228/42, 20

[56] References Cited

U.S. PATENT DOCUMENTS

| | | | |
|---|---|---|---|
| 3,605,244 | 9/1971 | Osborne et al. | 29/471.1 |
| 3,705,457 | 12/1972 | Tardoskegyi | 29/494 |
| 3,874,068 | 4/1975 | Cook | 228/180.1 |
| 3,924,794 | 12/1975 | Allen et al. | 228/256 |
| 4,072,777 | 2/1978 | Schoenthaler | 427/433 |
| 4,538,757 | 9/1985 | Bertiger | 228/180.1 |

Primary Examiner—Nicholas P. Godici
Assistant Examiner—Karen Skillman
Attorney, Agent, or Firm—R. B. Levy

[57] ABSTRACT

Failure of an electronic component (18) during soldering of leads (16—16) thereof to a substrate (12) can be reduced by directing a gas such as air across the top surface (13) of the substrate against the leads. The gas directed against the leads serves to drive off corrosive flux vapors which would otherwise migrate upwardly along the leads causing corrosion thereto and failure of the component.

6 Claims, 8 Drawing Figures

METHOD AND APPARATUS FOR ACHIEVING REDUCED COMPONENT FAILURE DURING SOLDERING

TECHNICAL FIELD

This invention generally relates to soldering and more particularly to a method and apparatus for reducing the likelihood of failure of an electrical component during soldering of the leads thereof to a substrate.

BACKGROUND OF THE INVENTION

Wave soldering is a well known process for bonding leads on an electronic component to metallized areas on the bottom surface of a substrate such as a printed circuit board. Generally, wave soldering is accomplished by first applying flux to the metallized areas on the bottom surface of the circuit board and to the tip portions of the leads received in apertures in the board so as to extend below the bottom surface thereof. The flux removes oxides on the tips of the leads and on the metallized areas on the board and also serves to wet the surfaces thereof. After the leads and the metallized areas have been fluxed, the component and the printed circuit board are heated, typically by way of infrared lamps, prior to passage over a fountain of solder. In this way thermal shock to the components on the board caused by hot solder from the fountain contacting a much cooler lead thereof is avoided. The circuit board is then passed over the fountain which produces a wave of solder that flows against the bottom surface of the circuit board to bond the tip portion of the leads extending below the bottom surface of the board to the metallized areas thereon.

In the past, the process of wave soldering has, for the most part, been performed using a rosin base flux. In an effort to increase the efficiency of the wave soldering process, more chemically active water soluble fluxes have been developed for use in place of less chemically active rosin base fluxes. The increased chemical activity of water soluble fluxes enables rapid removal of any oxides on the leads and on the metallized areas on the circuit board which allows for an increased number of circuit boards to be wave soldered in a given time.

Because they are chemically very active, water soluble fluxes have been known to cause corrosion of the leads of the component. Corrosion not only occurs at the tip portion of the lead where the flux is applied, but along the entire length of the lead as well. Such corrosion results from the upward migration along the lead of corrosive flux vapors produced when the flux, which coats the tips of the leads, is heated. Should the corrosion on the lead actually penetrate the component, then component failure may occur.

Accordingly, there is a need for a technique for reducing the likelihood of component failure caused by the use of corrosive fluxes during wave soldering.

SUMMARY OF THE INVENTION

The foregoing difficulties are overcome by the method of the present invention for soldering device leads passing through apertures in a substrate to land areas located about the apertures on the bottom surface of the substrate. The method comprises the steps of contacting the leads and the land areas with molten solder; while simultaneously directing a gas across the top surface of the substrate to drive away any corrosive vapors and to create a negative pressure in an aperture to draw up molten solder therein.

DETAILED DESCRIPTION

Figure 1:
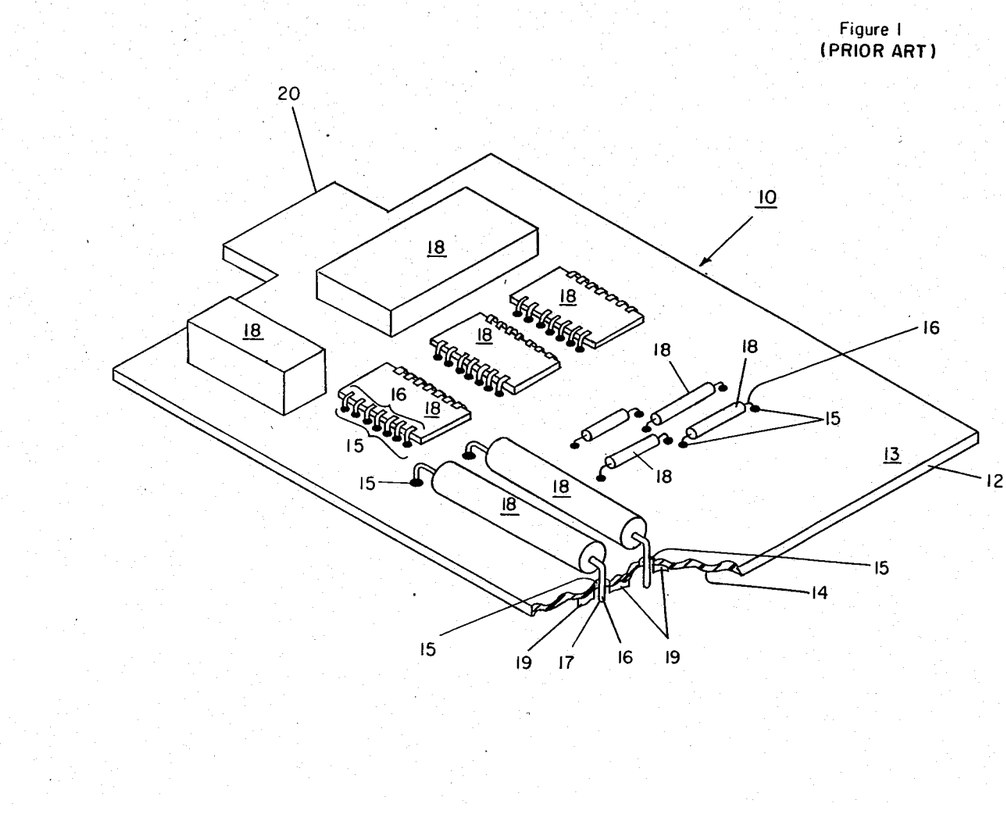
FIG. 1 is a perspective view of a circuit pack.

FIG. 1 is a perspective view of a circuit package 10, hereinafter referred to as a circuit pack, of the type found in various electronic equipments. The circuit pack 10 includes a printed circuit board 12 having upper and lower major surfaces 13 and 14, respectively. Extending through the board 12 between the surfaces 13 and 14 is a plurality of apertures 15—15. The apertures 15—15 are arranged in patterns, each corresponding to the pattern of leads 16—16 on each of a plurality of components 18—18. Typically, the components 18—18 comprise a combination of one or more integrated circuits, resistors, relay packages, transformers or the like, depending on the intended function of the circuit pack 10.

Figure 2:
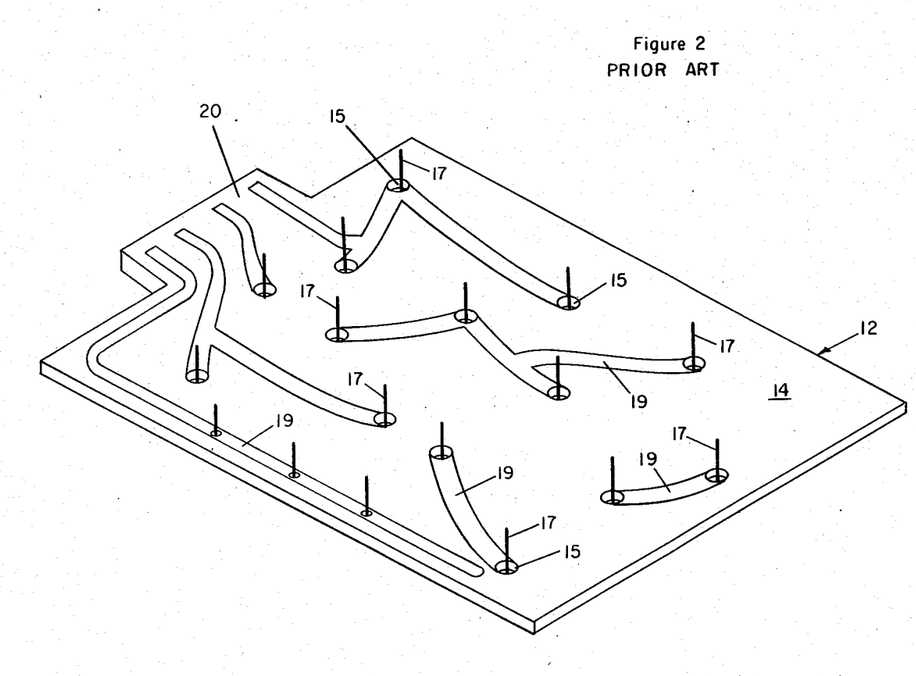
FIG. 2 is a perspective view of the obverse side of the circuit pack of FIG. 1.

Each lead 16 on each component 18 is received in a corresponding aperture 15 in the circuit board 12 so that a tip portion 17 of the lead extends below the lower major surface 14 thereon. As best illustrated in FIG. 2, the lower surface 14 of the circuit board 12 has a plurality of metallized areas 19—19 thereon, each surrounding an opening into a corresponding one of the apertures 15—15.

The metallized areas 19—19 are arranged to interconnect selected ones of the tip portions 17—17 of the leads 16—16 when they are bonded thereto so that the components 18—18 of FIG. 1 operate together to achieve the intended electrical function of the circuit pack 10. Some of the metallized areas 19—19 on the lower major surface 14 of the circuit board 12 extend onto the undersurface of a protruding tab 20 on the circuit board. The tab 20 is dimensioned to mate with an edge connector (not shown) which connects the metallized areas on the tab to other circuits (not shown).

Referring to FIGS. 3A and 3B and 4A and 4B, there is shown a plan view and a cross sectional side view in elevation, respectively, of a soldering machine 21 constructed in accordance with the teachings of the present invention for solder bonding the tip portions 17—17 of each of the leads 16—16 to the metallized areas 19—19 on the surface 14 of the circuit board 12 of FIG. 1. The soldering machine 21 of FIGS. 3A and 3B and 4A and 4B comprises a frame 22 which is constructed of a pair of parallel, elongated side members 24 and 26 which are inclined upwardly from left to right. A pair of columns 27 (see FIG. 4B) supports the right-hand end of each side member above the left-hand end thereof. The side members 24 and 26 are maintained in parallel, spaced relationship, by a plurality of cross members 28—28, each secured at the ends thereof by bolts 30—30 to a flange 32 running horizontally along the upper edge of each of the side members 24, 26.

Each of the side members 24, 26 has a major surface 34 thereon opposed to, and in facing relationship with, the corresponding surface on the other side member. Referring to FIGS. 4A and 4B, mounted on the surface 34 of each side member proximate the ends thereof is a pair of rotatably journaled drive sprockets 36—36 which are obscured from view in FIGS. 3A and 3B by the flanges 32—32. Looped about the drive sprockets 36—36 on each of the side members 24, 26 is an endless chain 38. An electric motor (not shown) rotatably drives the chains 38—38 in synchronism in a clockwise direction as indicated by the arrows 40—40 of FIG. 4B.

As seen in FIGS. 3A and 3B and 4A and 4B, each side member 24, 26 has a track 42 running horizontally along its facing surface 34 just below the flange 32. Each track 42 slidably supports one of the opposed edges of a carriage 44. Although one carriage 44 has been illustrated in FIGS. 3B and 4B, in practice, a plurality of carriages are each slidably supported, in spaced relationship, by the tracks 42—42.

Each carriage 44 has a plurality of pins (not shown) projecting downwardly from a separate one of the opposed edges thereof for engaging a separate one of the chains 38—38. When the chains 38—38 are rotatably driven by the electric motor in a clockwise direction, each carriage 44 is propelled along the side members 24 and 26 from left to right as indicated by the arrow 45 in FIG. 3B.

Figure 6:
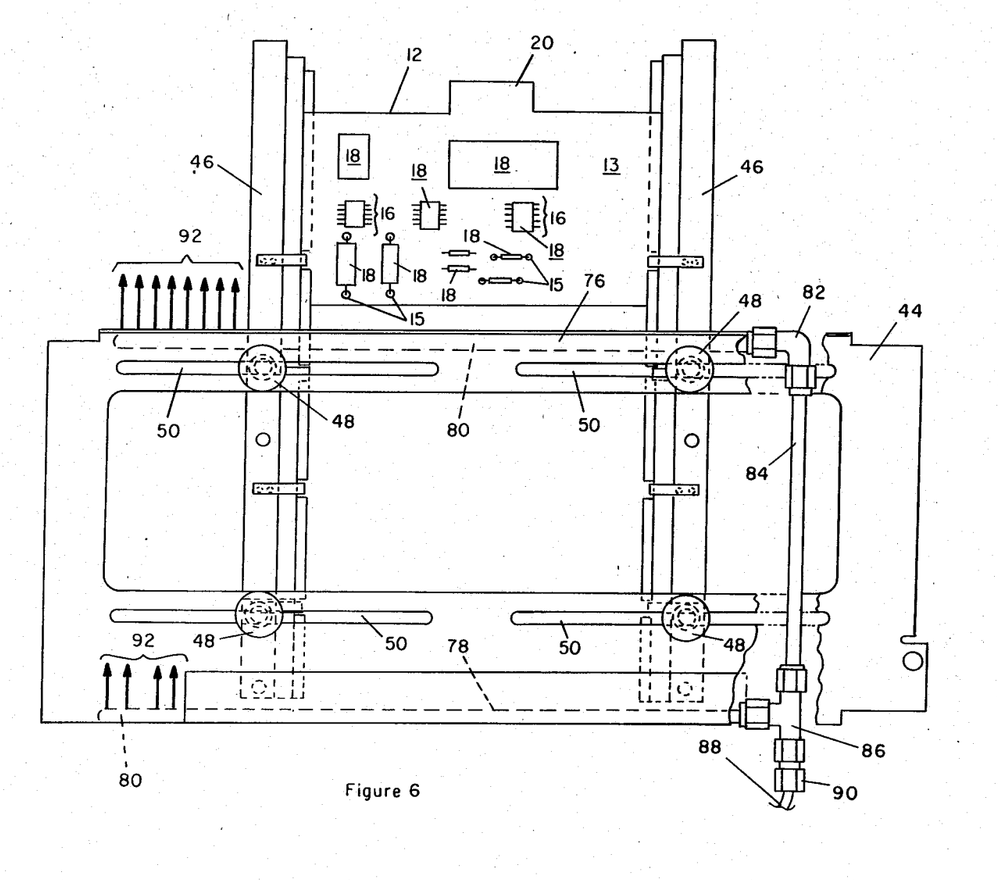
FIG. 6 is a plan view of a part of the apparatus of FIGS. 3A and 3B and 4A and 4B illustrating an alternate preferred embodiment of a mechanism for directing air against the circuit pack of FIG. 1 during the wave soldering process.

Referring to FIG. 6, each carriage 44 has a pair of parallel, spaced fingers 46—46 slidably mounted thereto and extending therefrom for gripping opposite ends of the circuit board 12 therebetween. Each of the fingers 46—46 is slidably mounted to the carriage 44 by a pair of bolts 48—48 each received in a corresponding one of spaced slots 50—50 which are spaced parallel to each other and perpendicular to each finger. The elongated slots 50—50 permit the spacing between the fingers 46—46 to be adjusted to accommodate circuit boards 12 of different widths.

Referring to FIGS. 4A and 4B, a flux pot 52, a preheat station 54 and a fountain 56 for producing a wave 58 of molten solder, are all located between the side members 24 and 26 so as to lie slightly below the carriage 44. The flux pot 52, the preheat station 54 and the fountain 56 are spaced a short distance apart along the path of travel of the carriage 44 so that the flux pot is upstream of the preheat station while the fountain is downstream therefrom.

The flux pot 52 is conventional in construction. Each of a pair of cylindrically shaped brushes 60—60 is rotatably journaled into the top of the flux pot 52 in spaced relationship so that each brush rotates about an axis perpendicular to the path of travel of the carriage 44 thereover. An electric motor (not shown) drives the brushes 60—60 in synchronism so that when the carriage 44 is displaced along the tracks 42—42 to bring the circuit board 12 over the flux pot 52, the brushes apply flux onto the metallized areas 19—19 (see. FIG. 2) and to the tip portions 17—17 of leads 16—16 (see FIG. 2) extending therebelow. The flux serves to remove any oxides on the metallized areas 19—19 and on the tip portions 17—17 of the leads 16—16 projecting therebelow as well as to wet the surfaces thereof.

From the flux pot 52, the circuit board 12 is carried over the preheat station 54. The preheat station 54 comprises a plurality of infrared lamps (not shown) which gradually heat the circuit board 12 and the components 18—18 thereon to a temperature close to that of the wave 58 of molten solder produced by the fountain 56. By preheating the circuit board 12 prior to passage over the fountain 56, stresses to the circuit board and to the components 18—18 thereon which would result from passing the board directly over the fountain without preheating, are avoided. After leaving the preheat station 54, the circuit board 12 is carried over the solder fountain 56, which is of a known construction. In practice, the solder pot comprises a model 382-1-K8 melting pot manufactured by Dee Electric, Chicago, Ill.

As the circuit board 12 passes over the fountain 56, the wave 58 of molten solder produced thereby contacts the undersurface 14 (see FIG. 2) of the circuit board causing the tip portions 17—17 of the leads 16—16 to bond to metallized areas 19—19 (see FIG. 2). Note that since the side members 24 and 26 are inclined, the circuit board 12 is also inclined as it travels over the wave 58 of molten solder, allowing for better drainage of solder away from the circuit board to prevent undesirable solder bridges between the adjacent tip portions 17—17 of leads 16—16 (see FIG. 2) projecting therebelow.

Typically, the carriage 44 moves continuously along tracks 42—42 at a speed which permits the steps of fluxing, preheating and wave soldering to be properly carried out in sequence. Once the circuit board 12 has passed over the fountain 56, the carriage 44 is transferred to a cleaning machine (not shown) which may be connected to, or separate and apart from, the soldering machine 21, for cleaning the circuit board. As the carriage 44 containing a now soldered circuit board 12 leaves the machine 21, another carriage containing a circuit board to be soldered is loaded on the machine upstream of the flux pot 52.

As described thus far, the soldering machine 21 operates as a conventional wave soldering machine.

Figure 3A:
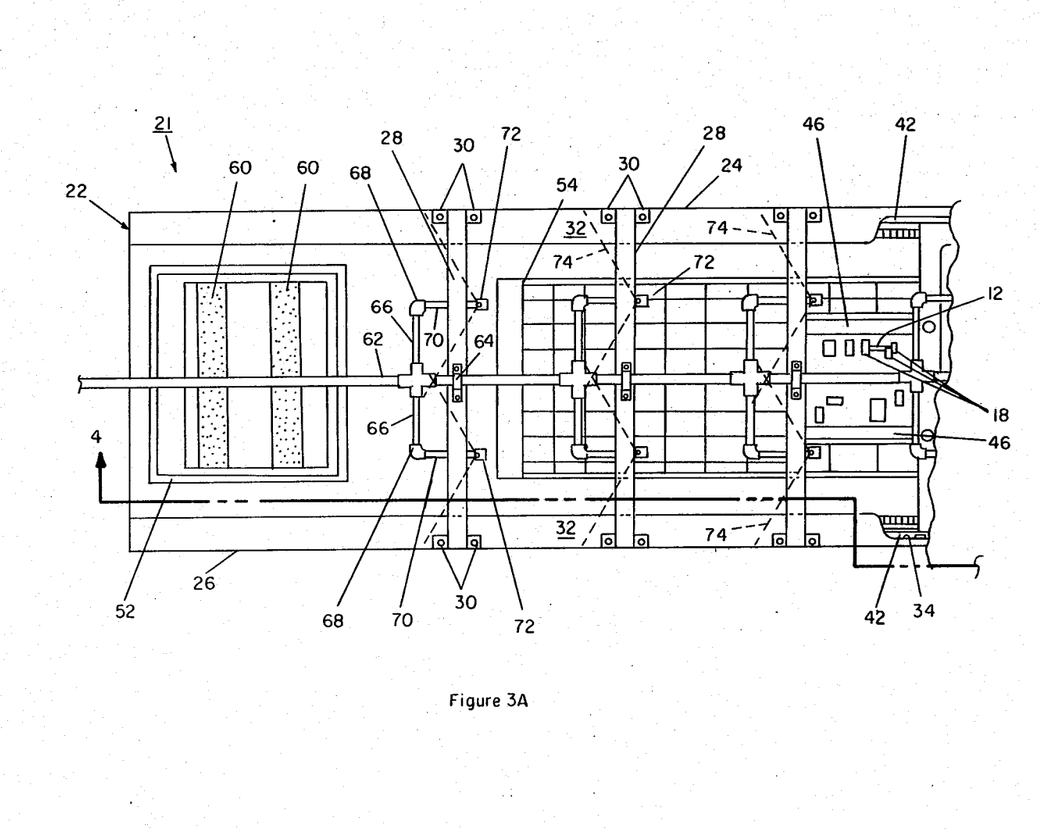
FIGS. 3A and 3B together are plan views of an apparatus for wave soldering the circuit pack of FIG. 1 in accordance with the teachings of the present invention.
Figure 3B:
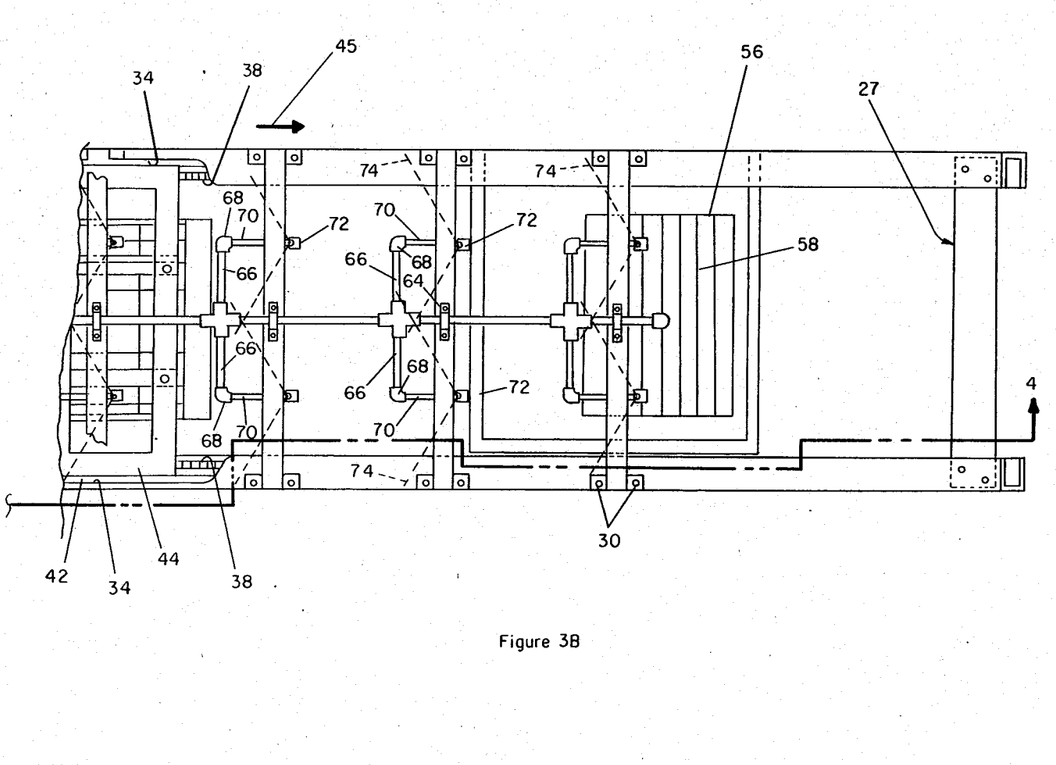
Figure 4A:
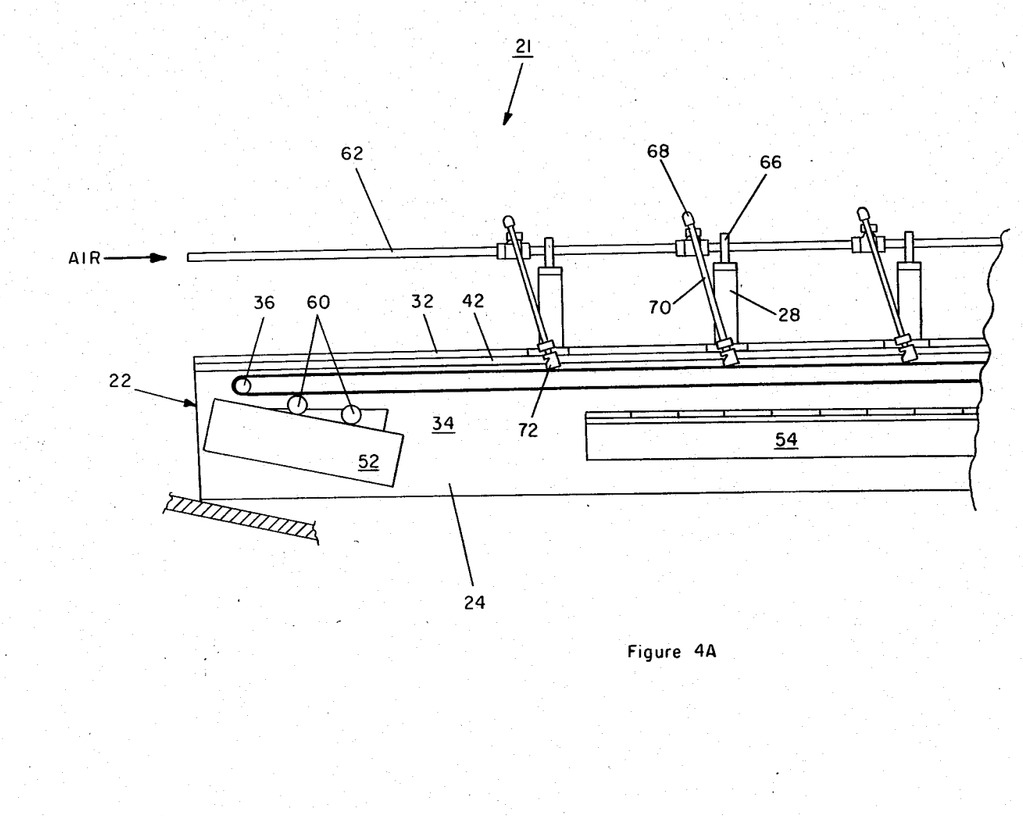
FIGS. 4A and 4B together are cross sectional side views in elevation of the apparatus of FIG. 3 taken along the plane 3—3 thereof.
Figure 4B:
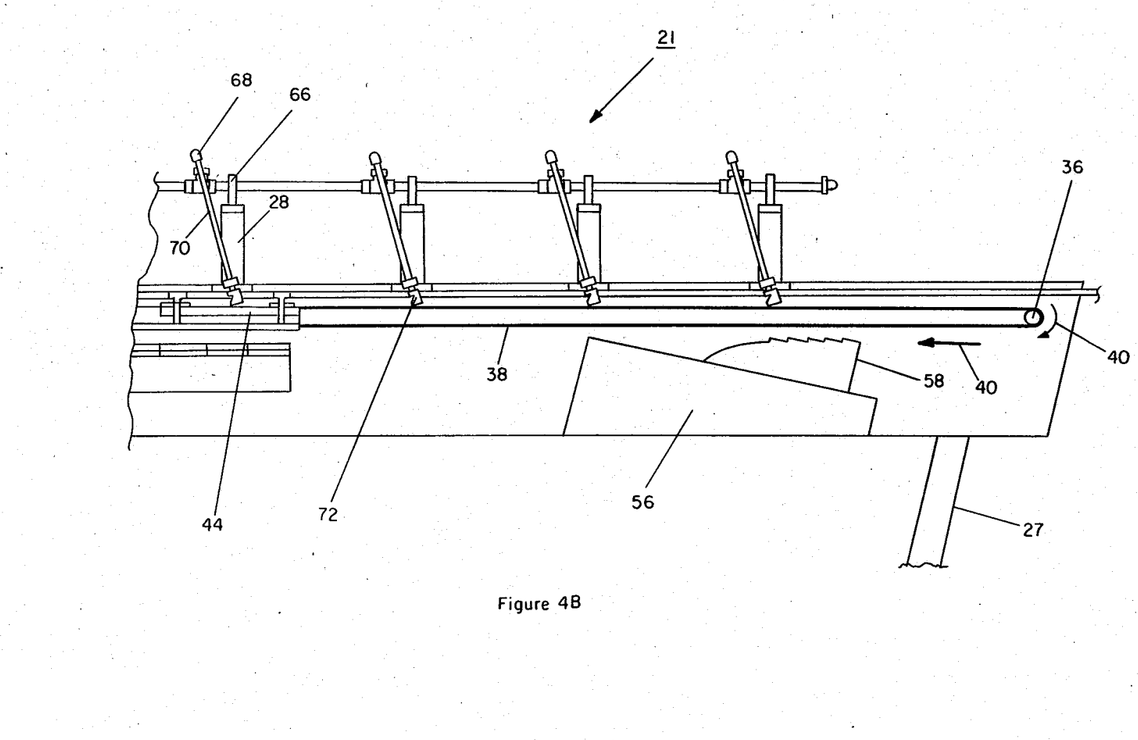

In practice, the flux pot 48 of FIGS. 3A and 4A may be filled with a water soluble flux. Water soluble fluxes are more chemically active than rosin based fluxes which have been used in the past for cleaning and wetting the metallized areas 19—19 (FIG. 2) on the circuit board 12 and the tip portions 17—17 of the leads 16—16 projecting therebelow (see FIG. 2). Heretofore, use of more chemically active water soluble fluxes has incurred the disadvantage that corrosion of the leads 16—16 often results when the flux applied to the tip portions 17—17 of the leads is heated, causing corrosive vapors 61—61, shown in FIG. 5, to be produced. The vapors 61—61 migrate upwardly through the apertures 15—15 along the leads 16—16, causing corrosion thereto. Should the corrosion on the leads 16—16 caused by the upward migration of vapors 61—61 therealong actually penetrate the component 18, then the component itself may corrode and fail.

We have found that the problem of failure of components 18—18 caused by corrosion of the leads 16—16 resulting from the upward migration of corrosive flux vapors 61—61 therealong can be reduced if not eliminated by directing a compressed gas such as argon, nitrogen or air, for example, against the leads as they are heated to drive off the vapors. Compressed air was selected for this purpose because of its ready availability in most manufacturing environments where soldering is carried out. To this end, the wave soldering machine 21 of FIGS. 3A and 3B and 4A and 4B has been advantageously constructed to include means for directing compressed air across the upper major surface 13 of the circuit board 12 against the leads 16—16 (FIG. 1) during the passage of the circuit board over the preheat station 54 and over the fountain 56 of FIGS. 3A and 4A as well as during the interval of transit therebetween.

Referring to FIGS. 3A and 3B and 4A and 4B, the means for directing compressed air against the leads 16—16 includes a central pipe 62 mounted to the cross members 28—28 by a separate one of a plurality of brackets 64—64 so the pipe is held parallel to, and intermediate between, the side members 24 and 26. The central pipe 62, which is actually a set of pipe sections joined together by tees (not shown), is connected by a plurality of pairs of tees (not shown) to each of a plurality of pairs of tubes 66—66. The tubes 66—66 of each pair are spaced from the tubes of every other pair and extend outwardly from the central pipe 62 in opposite directions a distance approximately ¼ the spacing between the side members 24, 26.

Each tube 66 is connected by an elbow 68 to a downwardly sloping conduit 70 (see FIGS. 4A and 4B) which has a nozzle 72 at the end thereof. The length of each conduit 70 and the angle at which it slopes downwardly from the tube 66 is selected so the nozzle 72 is spaced a short distance from the top surface of the circuit board 12 as the board passes thereunder as seen in FIG. 5.

When compressed air is admitted into the central pipe 62 of FIGS. 3A and 3B and 4A and 4B, a stream 74 of air is discharged from each of the nozzles 72—72. Referring to FIG. 5, each nozzle 72 is designed so that the stream 74 discharged therefrom has a very wide dispersion. As the circuit board 12 moves under each nozzle 72, the stream 74 discharged therefrom flows across the upper major surface 13 of the circuit board opposite to the direction of movement thereof but, in a direction generally parallel to the plane thereof to drive off vapors 61—61 migrating upwardly through the apertures 15—15 along the leads 16—16. In this way, corrosion to the leads 16—16 is significantly lessened, thereby reducing the likelihood that corrosion to the lead will penetrate the component 18 causing failure thereof.

There is an additional advantage obtained by discharging the streams 74—74 of air across the upper major surface 13 of the circuit board 12. As the streams 74—74 flow across the circuit board 12, a negative pressure is created within each of the apertures 15—15. While a negative pressure is present in each aperture 15, solder is drawn upwardly therein when circuit board 12 passes over the wave of solder 58 (see FIG. 4B) produced by the fountain 56 (see FIG. 4B) thereby enhancing the quality of the solder bond between each lead 16 and each metallized area 19 (FIG. 1).

Figure 5:
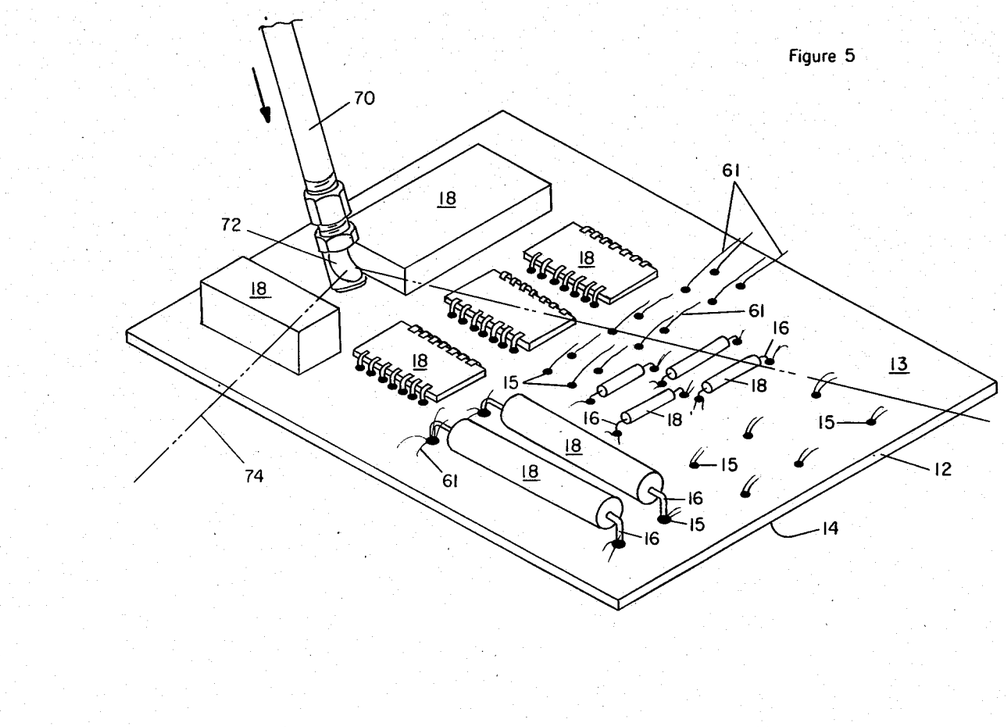
FIG. 5 is a perspective view of the circuit pack of FIG. 1 during the process of wave soldering on the machine of FIGS. 3A and 3B and 4A and 4B.

Instead of the arrangement shown in FIGS. 3A and 3B and 4A and 4B, an alternative arrangement may be provided for directing air against the leads 16—16 of the components 18—18 on the circuit board 12 of FIG. 1 for driving off the vapors 61—61 of FIG. 5. Referring to FIG. 6, the carriage 44 can be designed to mount a pair of spaced conduits 76, 78 so that each is perpendicular to the fingers 46—46. Each of the conduits 76, 78 has a plurality of spaced passages 80—80 therein, typically 0.031" in diameter, directed towards the circuit board 12 clamped between fingers 46—46.

An elbow 82 and a tube 84 couple one end of the conduit 76 to one end of a tee 86 whose nipple is coupled to one end of the conduit 78. The remaining end of each of conduits 76 and 78 are sealed, typically by way of an end cap (not shown). The tee 86 has its other end connected to one end of a coiled hose 88 by way of a quick release fitting 90. The other end of the hose 90 is connected to a source of compressed air (not shown).

When compressed air is admitted into the hose 88, the air is discharged from the openings 80—80 in the conduits 76 and 78 as a plurality of laminar streams 92—92. The streams 92—92 flow across the upper major surface 13 of the circuit board 12 in a direction generally parallel to the plane thereof and serve to drive off any vapors 61—61 (see FIG. 5) rising upwardly along the leads 16—16 of the components 18—18. Further, the streams 92—92 create a negative pressure in each of the apertures 15—15 in the circuit board 12 causing solder to be drawn upwardly therein as the circuit board passes over the fountain 56 of FIGS. 3B and 4B. Once the carriage 44 of FIG. 6 has passed over the fountain 56 of FIGS. 3B and 4B, the coiled hose 88 is disconnected from the fitting 90, allowing the carriage to be transferred to the cleaning machine.

Although the preferred embodiment of the invention has been described with respect to the wave soldering process, it is applicable to other soldering processes where corrosive flux vapors 61—61 tend to migrate upwardly along the leads 16—16 of components 18—18.

It is to be understood that the embodiments described herein are merely illustrative of the principles of the invention. Various modifications may be made thereto by persons skilled in the art which will embody the principles of the invention and fall within the spirit and scope thereof.

What is claimed is:

1. A method of soldering device leads, passing through apertures in a substrate, to land areas located about said apertures on the bottom surface of said substrate, the method comprising the steps of:
   contacting a lead and a land area with molten solder; while
   simultaneously directing a gas along the upper surface of the substrate against the lead in contact with the molten solder to reduce the incidence of corrosion to the lead by corrosive vapors.

2. The method according to claim 1 wherein said gas is air.

3. The method according to claim 1 wherein gas is directed in a plurality of laminar streams against the leads.

4. The method according to claim 1 wherein said gas is directed in a dispersed spray against the leads.

5. A method of bonding device leads passing through apertures in a substrate to metallized land ares located about the apertures on the bottom surface of the substrate comprising the steps of:
   applying a flux to the metallized area on the bottom surface of the substrate and to the tip portion of the lead passing therethrough;
   heating the lead and the substrate;
   passing the bottom surface of the substrate into contact with a wave of solder to bond the leads to the metallized areas on the bottom surface of the substrate; and directing a gas across the top surface of the substrate against the lead whose tip is in contact with the solder wave during the step of passing the substrate thereover to reduce the incidence of corrosion to the lead caused by corrosive vapors created upon heating of the flux as the bottom surface of the substrate passes over the solder wave.

6. The method according to claim 5 wherein during the step of heating the lead, gas is directed across the top surface of the board.

* * * * *